(12) United States Patent
Ditewig et al.

(10) Patent No.: US 7,095,648 B2
(45) Date of Patent: Aug. 22, 2006

(54) MAGNETORESISTIVE MEMORY CELL ARRAY AND MRAM MEMORY COMPRISING SUCH ARRAY

(75) Inventors: Anthonie Meindert Herman Ditewig, Eindhoven (NL); Roger Cuppens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 131 days.

(21) Appl. No.: 10/515,155

(22) PCT Filed: May 16, 2003

(86) PCT No.: PCT/IB03/02019

§ 371 (c)(1),
(2), (4) Date: Nov. 19, 2004

(87) PCT Pub. No.: WO03/098634

PCT Pub. Date: Nov. 27, 2003

(65) Prior Publication Data

US 2006/0062067 A1 Mar. 23, 2006

(30) Foreign Application Priority Data

May 22, 2002 (EP) ................... 02077000

(51) Int. Cl.
*G11C 11/00* (2006.01)
(52) U.S. Cl. ...................................... 365/158; 355/171
(58) Field of Classification Search ................ 365/158, 365/171, 173
See application file for complete search history.

(56) References Cited

U.S. PATENT DOCUMENTS 6,215,707 B1 * 4/2001 Moyer .................... 365/189.07
6,563,743 B1 * 5/2003 Hanzawa et al. ....... 365/189.02

* cited by examiner

*Primary Examiner*—Vu A. Le
(74) *Attorney, Agent, or Firm*—Peter Zawilski

(57) ABSTRACT

The present invention describes a matrix with magnetoresistive memory cells arranged in logically organized rows and columns, Each memory cell includes a magnetoresistive element. The matrix comprises means for simultaneously reading from one cell in a column and writing to another cell in a column, or means for simultaneous reading from one cell in a row and writing to another cell in the same row. Such matrix can be used in a read-while-write MRAM memory.

14 Claims, 7 Drawing Sheets

MAGNETORESISTIVE MEMORY CELL ARRAY AND MRAM MEMORY COMPRISING SUCH ARRAY

The present invention relates to a matrix of magnetoresistive memory cells and to non-volatile magnetic memories, more particularly to magnetoresistive random access memories (MRAMs), comprising such a matrix and methods of operating the same.

Magnetic or Magnetoresistive Random Access Memory (MRAM) is currently being considered by many companies as a successor to flash memory. It has the potential to replace all but the fastest static RAM (SRAM) memories. It is a non-volatile memory device, which means that no power is required to sustain the stored information. This is seen as an advantage over most other types of memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 6–9% magneto-resistance in good GMR cells.

A magnetic tunnel junction magnetoresistive random access memory (MTJ MRAM) comprises a plurality of magnetoresistive memory cells 1 arranged in an array. One such prior art memory cell 1 is shown in FIG. 1. Each memory cell 1 comprises a magnetoresistive memory element 2, a first intersection of a digit line 4 and a bit line 6, and a second intersection of the bit line 6 and a word line 8. The memory cells 1 are coupled in series in columns by means of the bit lines 6 and coupled in series in rows by means of the digit lines 4 and word lines 8, thus forming the array. The magnetoresistive memory elements 2 used are magnetic tunnel junctions (MTJs).

MTJ memory elements 2 generally include a non-magnetic conductor forming a lower electrical contact, a pinned magnetic layer, a dielectric barrier layer positioned on the pinned layer, and a free magnetic layer positioned on the dielectric barrier layer, with an upper contact on the free magnetic layer. The pinned magnetic layer and the free magnetic layer may both be composed of e.g. NiFe, and the dielectric barrier layer may e.g. be made of AlOx.

The pinned layer of magnetic material has a magnetic vector that always points in the same direction. The magnetic vector of the free layer is free, but constrained by the physical size of the layer, to point in either of two directions: parallel or anti-parallel with the magnetization direction of the pinned layer.

An MTJ memory element 2 is used by connecting it in a circuit such that electricity can flow vertically through the element 2 from one of the magnetic layers to the other. The MTJ cell 1 can be electrically represented by a resistor R in series with a switching element such as a transistor T, as shown in FIG. 1. The size of the resistance of the resistor R depends on the orientation of the magnetic vectors of the free and pinned magnetic layers of the memory element 2. The MTJ element 2 has a relatively high resistance (HiRes) when the magnetic vectors point in opposite directions, and it has a relatively low resistance (LoRes) when the magnetic vectors point in the same direction.

Cross-section and top views of an MTJ cell 1 according to the prior art are shown in FIG. 2, and a diagrammatic elevational view of a 2×2 array of prior art cells is shown in FIG. 3. In an MRAM array, comprising a plurality of MRAM cells, orthogonal conductive lines 4, 6 pass under and over each bit or memory element 2, carrying current that produces the switching field. Each bit is designed so that it will not switch when current is applied to just one line, but will switch when current is flowing through both lines that cross at the selected bit (switching will occur only if the magnetic vector of the free layer is not in accordance with the direction of the switching field).

Digit lines 4 and bit lines 6 are provided in an array of MTJ memory cells 1, where the digit lines 4 travel along the rows of the array on one side of the memory elements 2, and the bit lines 6 travel down the columns of the array on the opposite side of the memory elements 2. The structure in FIG. 3 is partially inverted for clarity purposes: digit lines 4 physically run underneath the MTJ elements 2 (at that side of the MTJ elements 2 oriented towards the substrate in which the transistor T is provided), and bit lines 6 physically run over the MTJ elements 2 (at that side of the MTJ elements 2 oriented away from the substrate in which the transistor T is provided). However, if drawn that way, the bit lines 6 would obscure the magnetoresistive elements 2, which are the more relevant parts of the drawing.

Each memory element 2 is a layered structure comprising a fixed or pinned layer 10, a free layer 12 and a dielectric barrier 14 in between. By applying a small voltage over the sandwich of ferromagnetic or ferrimagnetic layers 10, 12 with the dielectric 14 therebetween, electrons can tunnel through the dielectric barrier 14.

The memory element 2 is connected to the transistor T by means of an interconnect layer 16 and a plurality of metalization layers 18 and vias 20. There is a galvanic connection 22 between the memory element 2 and the bit line 6. The transistor T of each memory cell 1 is connected to a ground line 24.

In write or program mode, represented in FIG. 4, required currents flow through selected digit lines 4 and bit lines 6 so that at their intersection a peak magnetic field is generated, sufficient to switch the polarization of the free layer 12 of the MTJ element 2, so as to switch the resistance of the MTJ cell 2 from the LoRes (low resistance) state to the HiRes (high resistance) state or vice versa (depending on the direction of the current through the bit line 6). At the same time, the transistor T in the selected memory cell 1 is in the cut-off state by keeping the voltage on the word line 8 low (0 volt). For example in the embodiment represented in FIG. 4, the left cell is selected to be programmed. The current through the left bit line 6 is common for both the left cell and all other cells on that column. Current flows through the left digit line 4 of the left cell and all other cells on the same row, but not through the digit line 4 of the cells at the right. The currents in the digit line 4 and bit line 6 are such that together they provide a magnetic field able to change the direction of the magnetic vector of the free layer of the foreground left hand cell, but the current in either strip by itself is not able to change the storage state. Therefore only the selected memory cell (the left one in the example given) is written.

The information stored in a selected memory cell 1 (the left cell in the example of FIG. 5) is read by comparing its resistance with the resistance of a reference memory cell located along a same word line 8. The MTJ elements 2 in reference memory cells are not programmed, and their resistance value always remains at, for example, the minimum level. A memory cell 1 is selected by driving the word line 8 of that cell to $V_{DD}$ and in that way selecting a row and turning on all transistors. Current is sent through the bit line 6 of the column in which the selected cell is located. Since, of the memory cells in that column, only the transistor associated with a selected MTJ cell 1 is activated, current can only flow from the selected bit line 6 to the ground line 24 through the selected cell 1. Generally, during a readout operation of the whole or a part of the memory array, a first bit line 6 will be activated, and the word lines 8 will then be sampled sequentially, i.e. for each cell of each row.

In TMR devices, a sense current has to be applied perpendicular to the layer planes (CPP—current perpendicular to plane) because the electrons have to tunnel through the barrier layer.

It is a disadvantage of the known MRAM memories that it is not possible to read one memory cell while writing another memory cell on the same row or column.

It is an object of the present invention to overcome the disadvantage of the prior art MRAM memories. It is an object to provide fast MRAM memories.

The above objectives are accomplished by the devices and method of the present invention.

The present invention describes a matrix with magnetoresistive memory cells arranged in logically organized rows and columns, wherein each memory cell includes a magnetoresistive element. The matrix furthermore comprises means for simultaneously reading from one cell in a column and writing to another cell in a column, or means for simultaneous reading from one cell in a row and writing to another cell in the same row.

The means for simultaneously reading and writing in a row or a column may comprise a first column line and a second column line for each column, the first column line being a write bit line and the second column line being a read bit line. The first column line is then a continuous conductive strip which is magnetically couplable to the magnetoresistive element of each of the memory cells of the column, and the second column line is a continuous conductive strip which is electrically couplable to an electrode of each of the same magnetoresistive elements of the memory cells of the column to which the first column line is magnetically couplable.

Each row may have a digit line and a word line and each cell may have a switching element for connecting another electrode of the magnetoresistive element to a voltage source. The digit line is a continuous conductive strip which is magnetically couplable to the magnetoresistive element of each of the memory cells of a row and the word line is a continuous strip electrically connected to each of the switching elements of a row.

A closest approach distance of the first column line to the magnetoresistive element of a cell may be smaller than a closest approach distance of the second column line to the same magnetoresistive element.

The magnetoresistive elements in the matrix may comprise a magnetic tunnel junction (MTJ).

A matrix according to the present invention may be connected to selecting circuitry for selecting a cell to be read and a cell to be written, so as to form a read-while-write MRAM memory. The selecting circuitry may comprise a row select decoder and a column select decoder.

The selecting circuitry may be adapted to provide electrical energy to the first and second column lines, the digit lines and the word lines for simultaneously reading of one cell in a column and writing to another cell in the same column or reading from one cell in a row and writing to another cell in the same row. A row current source may be connected to the row select decoder for providing a selected digit line with electrical energy. A write bit line current source may be connected to the column select decoder for providing a selected write bit line with electrical energy.

Furthermore, sense amplifiers connectable to the second column lines may be provided for sensing current in the second column lines for reading out selected memory cells.

A method of operating a matrix with magnetoresistive memory cells arranged in logically organized rows and columns, each cell including a magnetoresistive element, is also provided. The method comprises simultaneously reading from one cell in a column and writing to another cell in the same column or simultaneously reading from one cell in a row and writing of another cell in the same row.

The method may furthermore comprise a selecting step for selecting one row for reading and another row for writing or selecting one column for reading and another column for writing. The selecting step may include providing electrical energy to a write bit line which is magnetically couplable to the magnetoresistive element to be written, to a read bit line which is electrically couplable to a first electrode of the magnetoresistive element to be read, to a digit line which is magnetically couplable to the memory element to be written and to a word line which is electrically connected to a switching element for connecting a second electrode of the magnetoresistive element to be read to a voltage source.

Other features and advantages of the present invention will become apparent from the following detailed description, taken in conjunction with the accompanying drawings, which illustrate, by way of example, the principles of the invention.

In the different Figs., the same reference numbers refer to the same or analogous elements.

Figure 1:
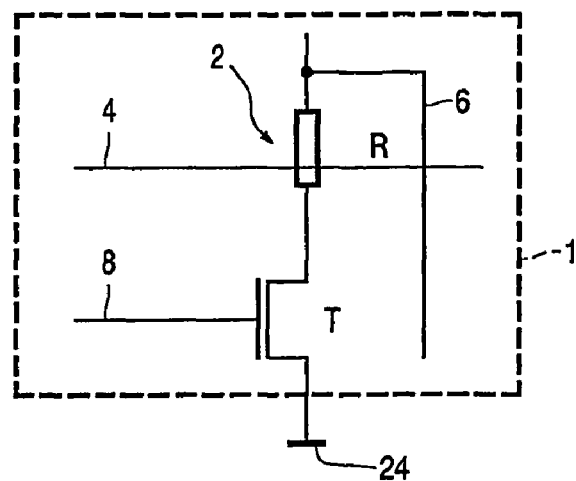
FIG. 1 is an electrical representation of an MTJ cell for connection in an array according to the prior art.
Figure 2:
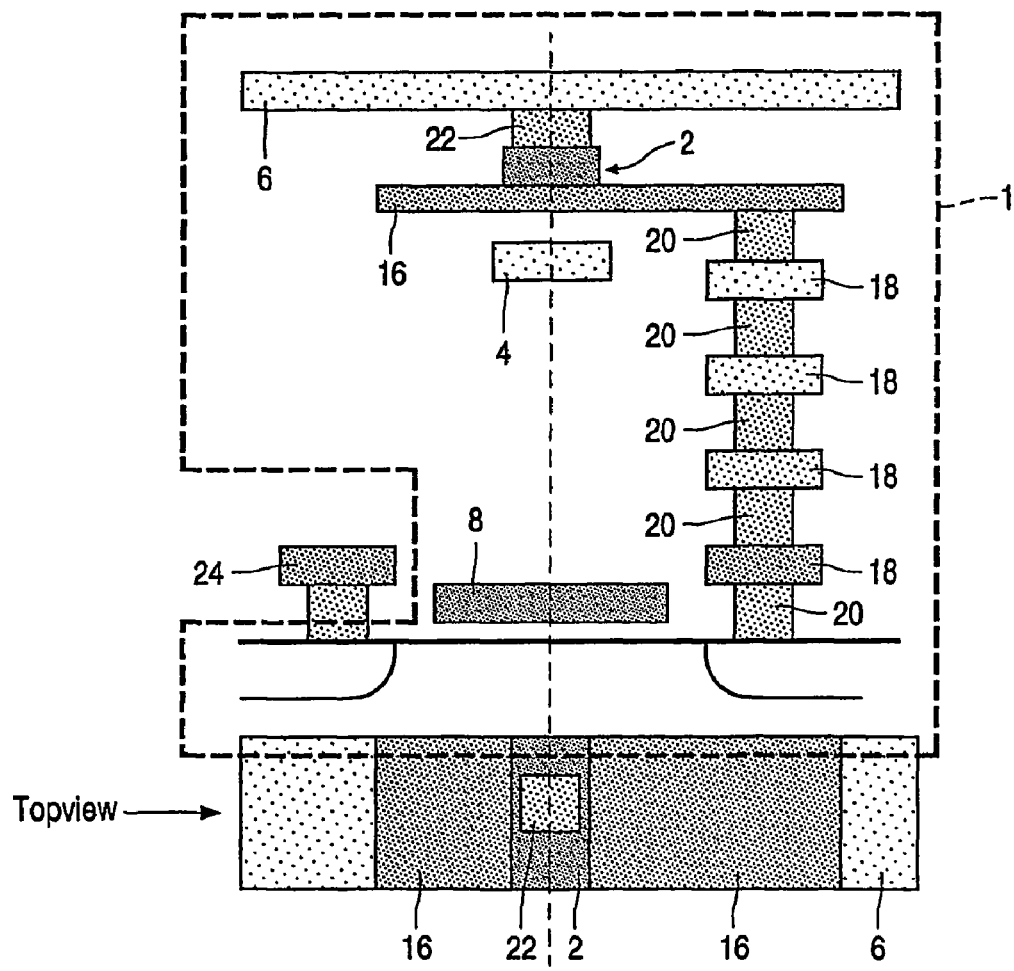
FIG. 2 shows a cross-section and a schematic top view of an MTJ cell with line 6 partly removed according to the prior art.
Figure 3:
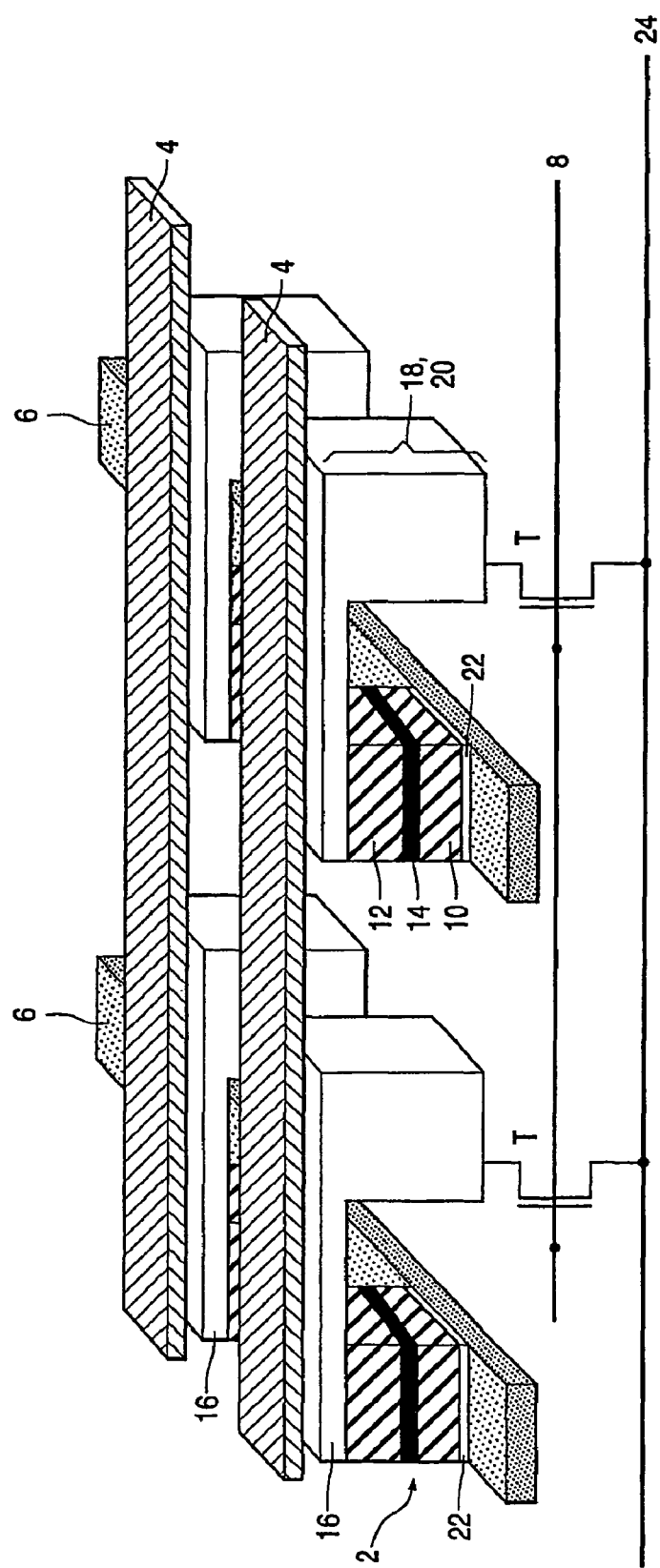
FIG. 3 is a diagrammatic elevational view of a 2×2 array of MTJ cells according to the prior art.
Figure 4:
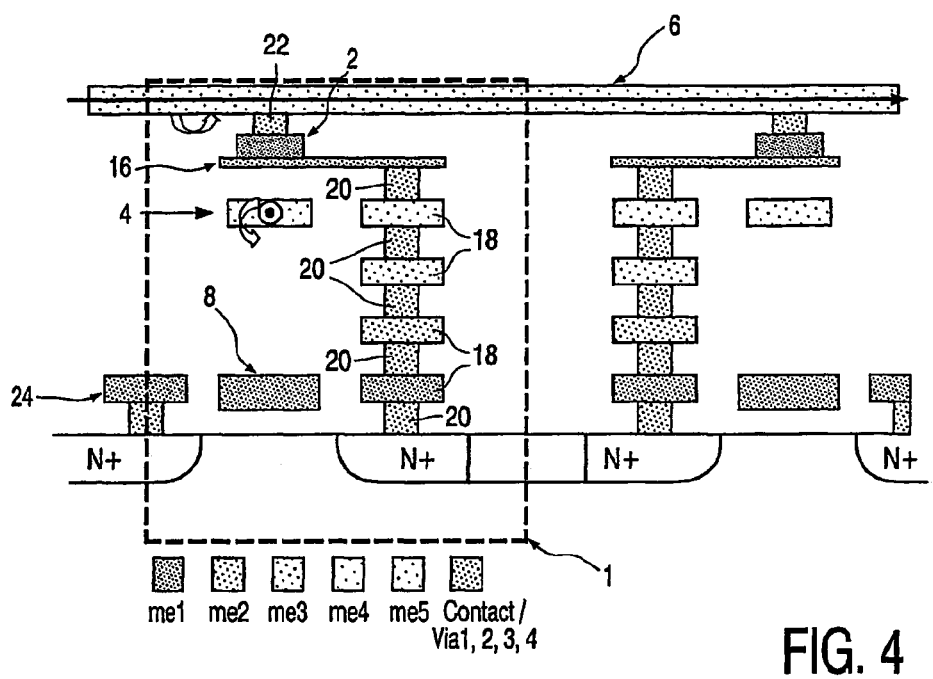
FIG. 4 illustrates the conventional process of programming an MTJ memory cell.
Figure 5:
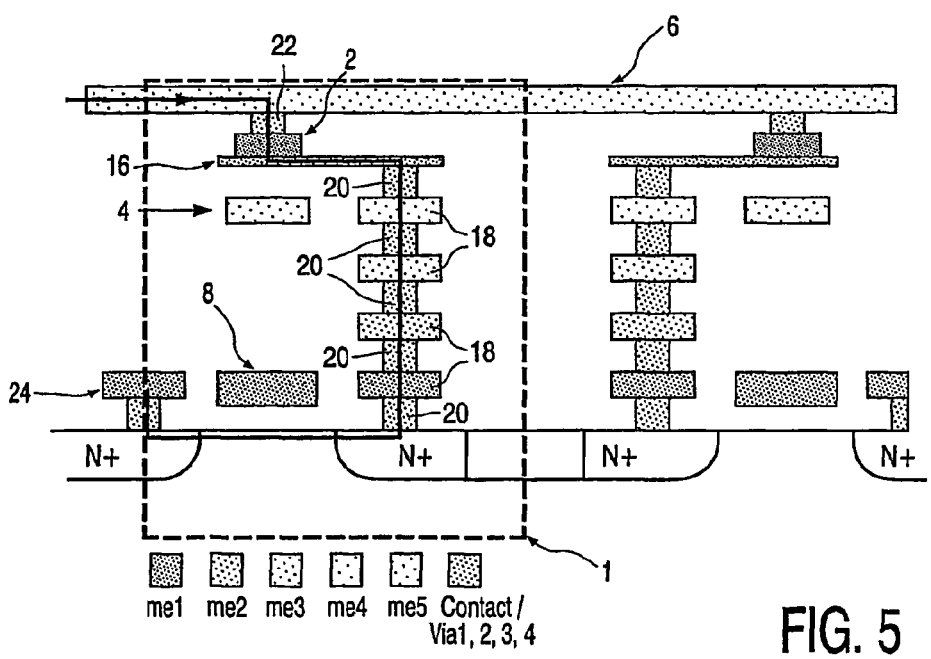
FIG. 5 illustrates the conventional process of reading an MTJ memory cell.

The present invention will be described with respect to particular embodiments and with reference to certain drawings but the invention is not limited thereto but only by the claims. The drawings described are only schematic and are non-limiting. In the drawings, the size of some of the elements may not be drawn on scale for illustrative purposes. Where the term "comprising" is used in the present description and claims, is does not exclude other elements or steps. Where an indefinite or definite article is used when referring to a singular noun e.g. "a" or "an", "the", this includes a plural of that noun unless something else is specifically stated.

Throughout this description, the terms "column" and "row" are used to describe sets of array elements which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of memory elements are linked together in a topologically linear intersecting manner however, that the physical or topographical arrangement need not be so. For example, the rows may be circles and the columns radii of these circles and the circles and radii are described in this invention as "logically organized" rows and columns. Also, specific names of the various lines, e.g. bit line, word line, digit line, etc. are intended to be generic names used to facilitate the explanation and to refer to a particular function and this specific choice of words is not intended to limit the invention.

Figure 6:
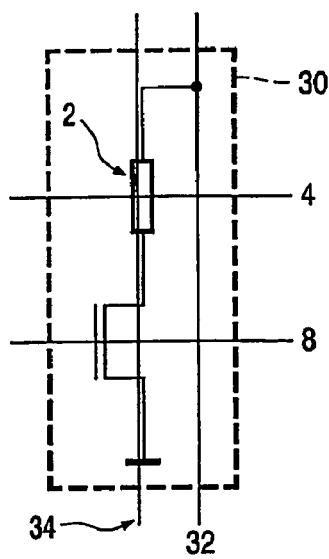
FIG. 6 is an electrical representation of an MTJ cell for connection in an array according to an embodiment of the present invention.
Figure 7:
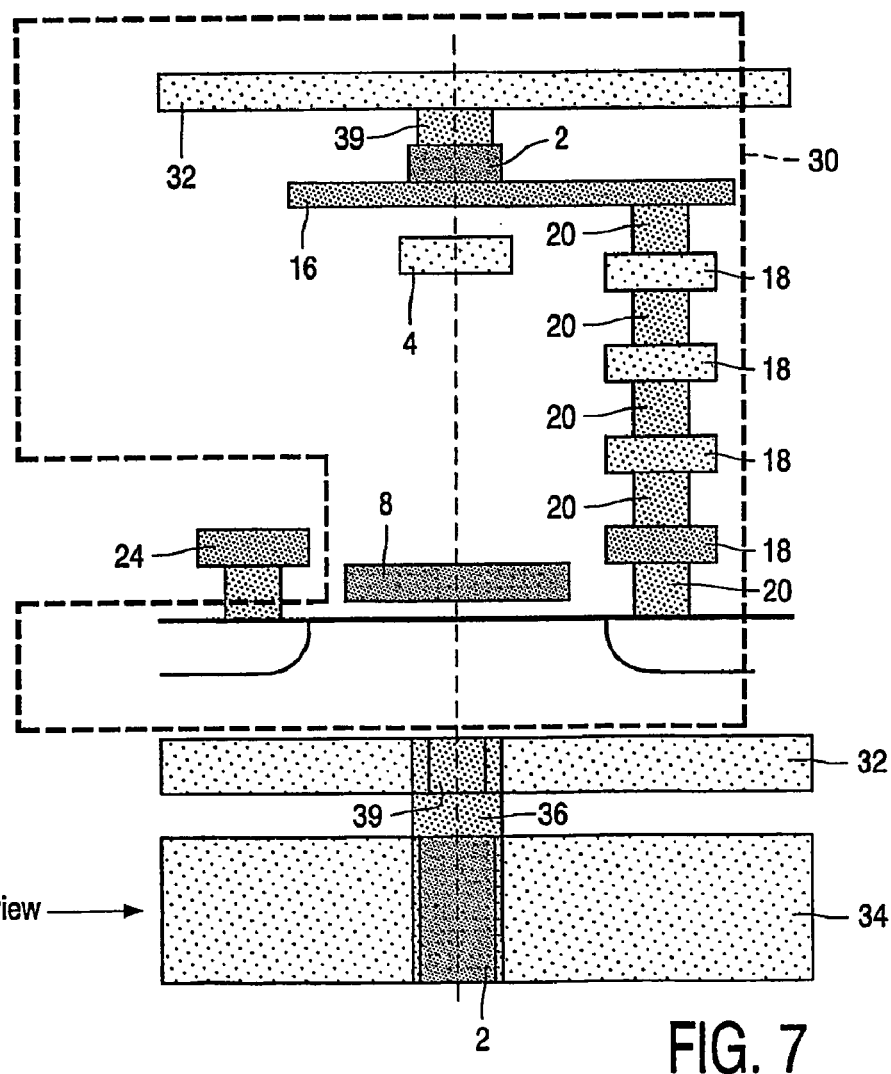
FIG. 7 shows a cross-section and a partly sectioned top view of an MTJ cell according to an embodiment of the present invention.

An MTJ memory cell, which can be used in a memory array according to an embodiment of the present invention, is shown schematically in FIG. 6 and in cross-section and in partly sectioned topview in FIG. 7. As can be seen from these drawings, more particularly from FIG. 6 and from the top view part of FIG. 7, for one MTJ memory cell 30 according to the present invention, two bit lines are provided: a read bit line 32 and a write bit line 34. The write bit line 34 is not connected, and thus not electrically couplable, to the MTJ element 2. It is however magnetically coupled to the MTJ element 2 when current is flowing therein. The read bit line 32 is galvanically connected to the MTJ element 2, e.g. by means of a connect layer 36 and a via 39, and is therefore electrically couplable to the MTJ element 2. The two bit lines 32, 34 can only be seen in the top view as they run in parallel. All other elements of the memory cell 30 are as explained above for the prior art memory cell 1.

Figure 8:
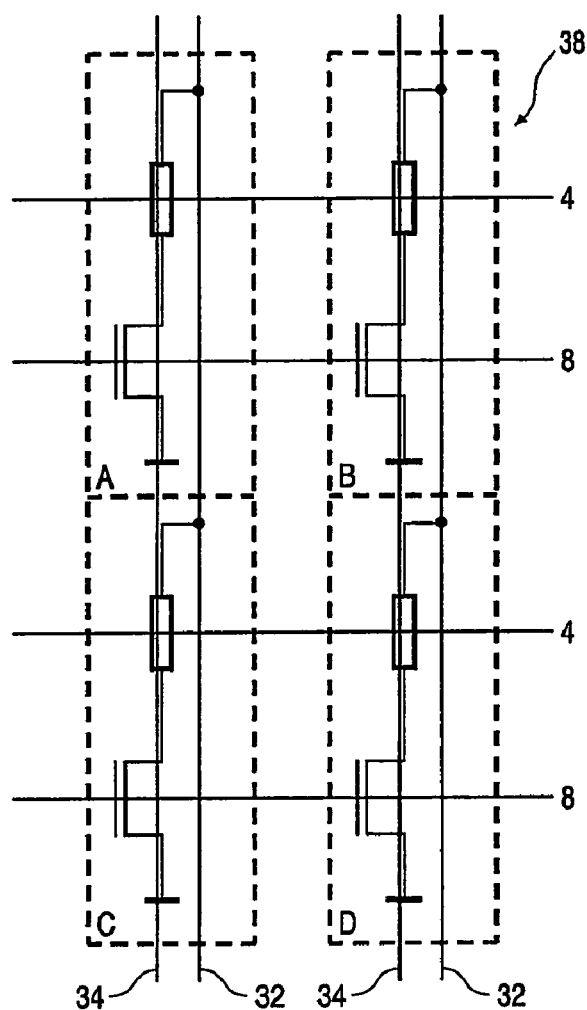
FIG. 8 shows an electrical representation of a 2×2 matrix of MTJ cells according to an embodiment of the present invention.
Figure 9:
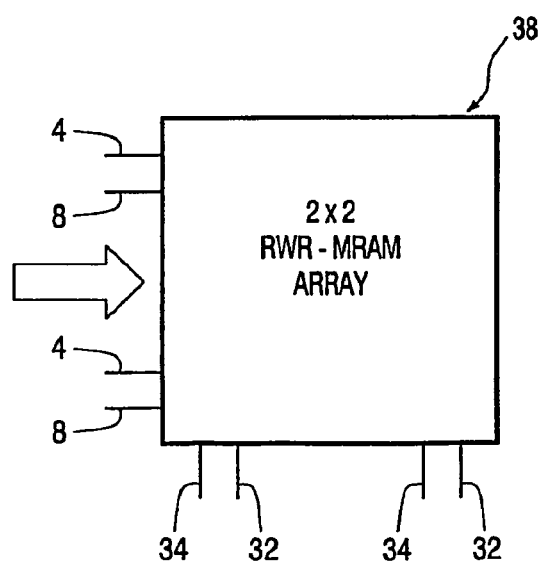
FIG. 9 shows a schematic block diagram of the matrix of FIG. 8.
Figure 10:
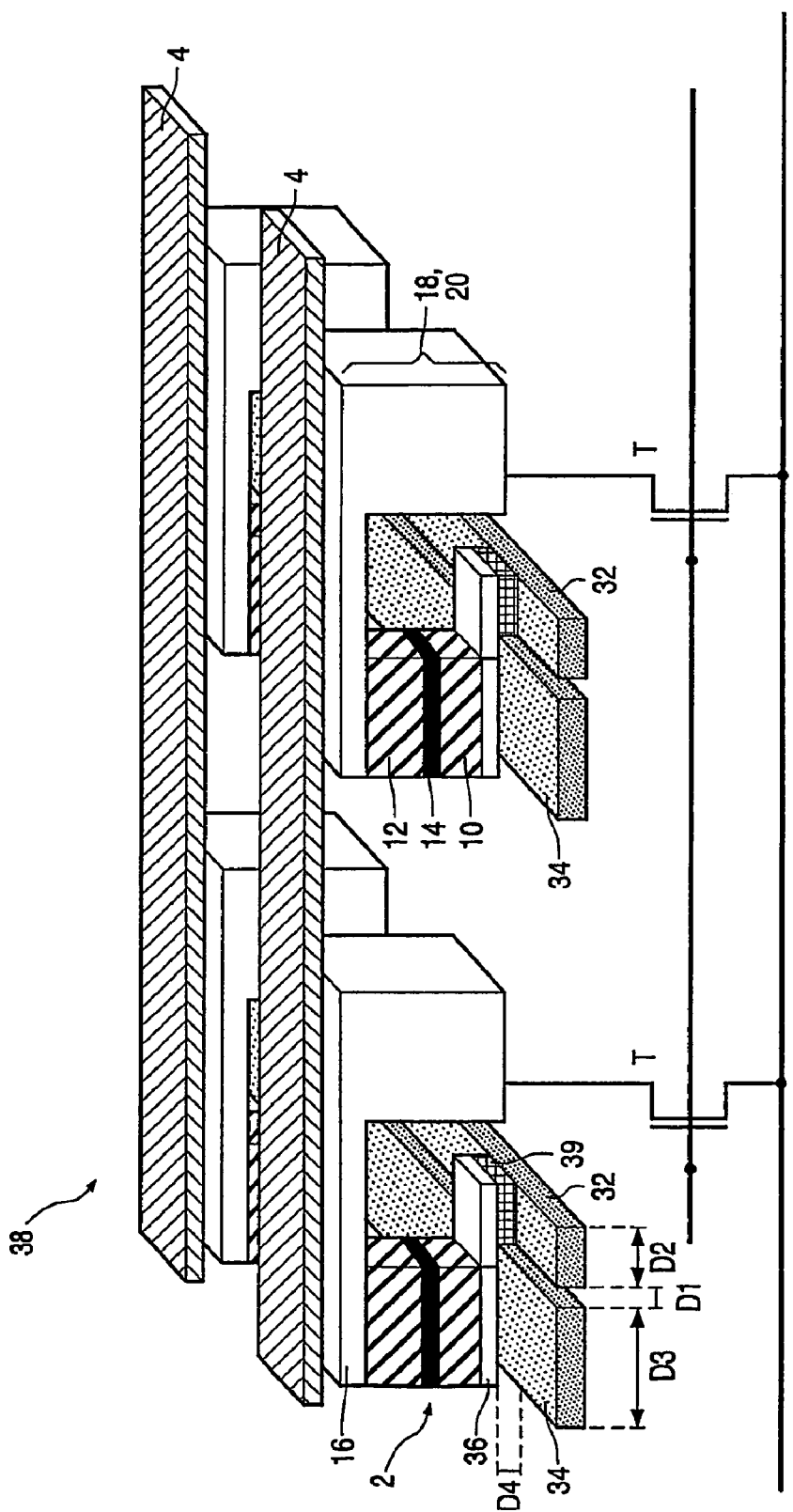
FIG. 10 is a diagrammatic elevational view of the 2×2 matrix of FIG. 8, wherein the magnetoresistive memory elements are MTJ elements.
Figure 11:
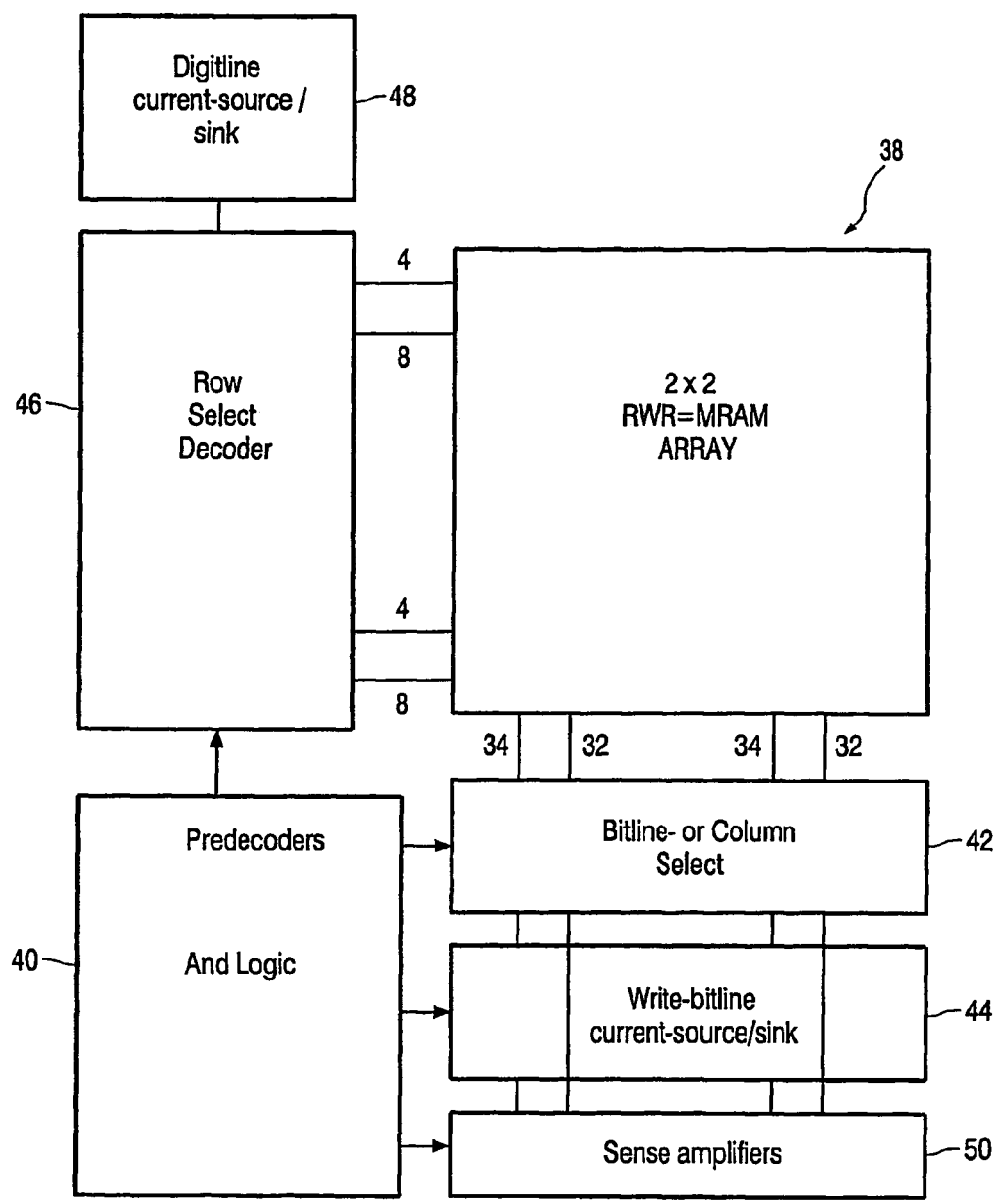
FIG. 11 shows a simplified block schematic of an MRAM memory according to an embodiment of the present invention.

A matrix 38 of 4 of these MRAM cells 30, called cells A, B, C and D, is shown schematically in FIG. 8, or in a simplified block schematic in FIG. 9. A diagrammatic elevational view is shown in FIG. 10. It is to be noted that FIG. 8 to FIG. 11 concern a 2×2 array only. In reality the memory array 38 will generally be a lot larger. It is furthermore to be noted that the structure in FIG. 10 is partially inverted for clarity purposes: digit lines 4 physically run underneath the MTJ elements 2 (at that side of the MTJ elements 2 oriented towards the substrate in which the transistor T is provided), and write bit lines 34 physically run over the MTJ elements 2 (at that side of the MTJ elements 2 oriented away from the substrate in which the transistor T is provided). Read bit lines 32 are physically located adjacent write bit lines 34. However, if drawn that way, the read and write bit lines 32, 34 would obscure the magnetoresistive elements 2.

It can be seen in FIG. 8 and FIG. 10 that bit lines 32, 34 are common for all memory cells 30 in one column of the memory array 38, and that digit lines 4 and word lines 8 are common for all memory cells 30 in a row of the memory array 38. A word line 8 is connected to a switching element T in each cell, e.g. to a transistor switching element.

The space D1 between the read bit line 32 and the write bit line 34 is preferably the minimum metal pitch of the manufacturing process in which the MRAM cells 30 are made, e.g. typically limited by lithography. The width D2 of the read bit lines 32 is preferably as close as possible to the minimum metal width of the manufacturing process with which the MRAM cells 30 are made, e.g. typically limited by lithography. It may be somewhat larger than this minimum width, however. The width D3 of the write bit lines 34 is preferably at least that width that substantially covers the MTJ element 2.

The distance D4 between the MTJ element 2 and the write bit line 34 is somewhat larger than in a conventional MRAM cell 1. It should, however, preferably be kept as small as possible. As an example, the distance D4 can be equal or less than a regular oxide thickness between two subsequent metallization layers.

When in the memory array 38, for example a cell A (see FIG. 8) needs to be written and cell C needs to be read, the operation is as follows (with reference to FIG. 11):

Blocks 40, 42, 44, 46, 48 form together selecting circuitry. Through a "predecoders and logic" block 40, cell A is selected for write. This means that the appropriate write bit line 34 is connected through a "bit line or column select" block 42 to a "write bit line current source" 44. The "precoders and logic" block 40 together with a "row select decoder" 46 selects cell A also for write, which means that the appropriate digit line 4 is connected with a "digit line current source" 48. The word line 8 of the cell to be written in is set to a value to turn off the associated switching element T, e.g. in case of a transistor, for instance, zero volt. In this way, current flows through both the write bit line 34 and the digit line 4 of the selected cell. Those currents together provide a magnetic field able to change the direction of the magnetic vector of the free layer 12 of the memory element 2, while the current in either strip by itself is not able to change the storage state. The current levels are designed to be much smaller than the field required to rotate the magnetization of the pinned layer 10. The resistance of the MTJ cell 2 is brought in this way to a LoRes or HiRes (depending on the direction of the current through the bit line 34, which is dependent on the content to be stored in the memory cell 2). The relative resistance change between HiRes and LoRes depends on the voltage applied to the bit line: it is about 25% at a bit line voltage of 0.6V, about 35% at a bit line voltage of 0.3V and about 45% at a bit line voltage of 0.1V.

The created magnetic field H is related to the write current I as follows: H=I/6.28R, where H is the magnetic field at a radius R from the center of the field. The center of the field is the metal wire in which the current I flows.

The write current through the write bit line 34 is between 0.5 mA and 5 mA. The write current in the MRAM cell 30 according to the present invention needs to be somewhat higher than in prior art devices, because the distance between line 34 and the magnetic layers of the memory element is slightly larger than when the prior art write bit line 6 was attached to the memory element 2. The write current to be used depends on the size of the memory element 2 and on the technology used.

At the same moment of writing to cell A, cell C (FIG. 8) is selected for read. This means that the "bit line or column select" block 42 connects the read bit line 32 of cell C (which happens to be also the read bit line 32 of cell A in the example given) with the "sense amplifiers" 50. The "row select decoder" 46 applies to the word line 8 of the row on which cell C is located, a voltage suitable to turn the associated switching element T in the on-state. For example in case of a transistor as switching element T, the applied voltage can be Vdd. At that moment, the read bit line 32 is electrically coupled to the MTJ element 2. The state of the memory cell 30 is determined by measuring the resistance of memory element 2 when a sense current much smaller than the write currents (typically in the μA range), is passed perpendicularly through the memory element 2. The magnetic field of this sense or read current is negligible and does not affect the magnetic state of the memory cell 30. The probability of tunneling of charge carriers across the tunnel barrier layer 14 depends on the relative alignment of the magnetic moments of the free layer 12 and the pinned layer 10. The tunneling probability of the charge carriers is highest, and thus the resistance lowest, when the magnetic moments of both layers are aligned. The tunneling probability of the charge carriers is lowest, and thus the resistance highest, when the magnetic moments are anti-aligned. As a result, the two possible magnetization directions of the free layer uniquely define two possible bit states (0 or 1) for the memory cell.

Cell A can thus be written, and cell C can be read at the same time, cell A and cell C being two cells on the same column of the array. Or, in other words, the matrix or array 38 described can be used in a read-while-write operation.

If cell A has to be written, and cell B has to be read, the write bit line 34 of cell A and the digit line 4 of cell A are connected to their respective current sources 44, 48. Furthermore, the read bit line 32 of cell A is disabled by disconnecting it from the sense amplifiers 50. For cell B, the write bit line 34 is disabled of course, but the read bit line 32 of cell B is connected to the sense amplifiers 50. Also the word line 8 of the switching element, e.g. selecting transistor T of cell B (and automatically for cell A, but this does not have consequences) is applied with a voltage which sets the switching element, e.g. selecting transistor T in the on-state.

Now cell A can be written and cell B can be read at the same time, cell A and cell B being two cells on the same row of the array.

When a write operation is ongoing, a high current (mA range) in the write bit line 34 will induce a magnetic field. Through the read bit line 32, which is parallel to the write bit line 34, a small current will flow in the μA range, which is basically the current through the read MTJ and the switching element, e.g. the selecting transistor of the MRAM cell. This small current will cause only a small magnetic field, which does not influence the storage state of the MTJ. It is noted that this small magnetic field in the read bit line 32 is in distance farther away from the MTJ element 2 than the write bit line 34, which reduces the effect of the small magnetic field on the MTJ element 2 even further.

In principle, the speed of operation of the MRAM memory array 38 can be doubled with regard to the speed of a prior art MRAM memories with one bit line because write and read operations on different cells can now be done simultaneously. For example, in 0.6 μm technology, a write or read speed of 18 ns can be reached. In future more advanced technologies, still higher read and write speeds will be possible.

As for the prior art devices, an MRAM memory according to the present invention can also be used for separate read and write operations by only selecting one memory cell at a time. Read and write operations can also be carried out at the same moment on different cells when they are located on different rows and columns.

It is to be understood that although specific constructions and configurations, as well as materials, have been discussed herein for devices according to the present invention, deviations can be made therein without departing from the spirit and scope of the present invention.

According to a further embodiment (not represented in the drawings), the switching element T can also be connected between the read bit line 32 and the memory element 2 (instead of between the memory element 2 and the ground line 24). The switching element T can again be switched on or off by means of a word line 8. The switching element T may be for example a transistor, the word line 8 being connected to its gate. In this case, a memory element 2 is only electrically connected to the read bit line 32 at the moment of being read.

The invention claimed is:

1. A matrix (38) with magnetoresistive memory cells arranged in logically organized rows and columns, each memory cell including a magnetoresistive element (2), furthermore comprising means for simultaneously reading from one cell in a column and writing to another cell in a column, or means for simultaneous reading from one cell in a row and writing to another cell in the same row.

2. A matrix (38) according to claim 1, wherein the means for simultaneously reading and writing in a row or a column comprise a first column line (34) and a second column line (32) for each column, the first column line (34) being a write bit line and the second column line (32) being a read bit line, the first column line (34) being a continuous conductive strip which is magnetically couplable to the magnetoresistive element (2) of each of the memory cells of the column, the second column line (32) being a continuous conductive strip which is electrically couplable to an electrode of each of the same magnetoresistive elements (2) of the memory cells of the column to which the first column line (34) is magnetically couplable.

3. A matrix (38) according to claim 2, wherein each row has a digit line (4) and a word line (8) and each cell has a switching element (T) for connecting another electrode of the magnetoresistive element (2) to a voltage source (24), the digit line (4) being a continuous conductive strip which is magnetically couplable to the magnetoresistive element (2) of each of the memory cells of a row and the word line (8) being a continuous strip electrically connected to each of the switching elements (T) of a row.

4. A matrix (38) according to claim 2, wherein a closest approach distance of the first column line (34) to the magnetoresistive element (2) of a cell is smaller than a closest approach distance of the second column (32) line to the same magnetoresistive element (2).

5. A matrix (38) according to any of the previous claims, wherein the magnetoresistive elements (2) comprise a magnetic tunnel junction (MTJ).

6. A read-while-write MRAM memory comprising a matrix (38) according to any of the previous claims and selecting circuitry for selecting a cell to be read and a cell to be written.

7. A read-while-write MRAM memory according to claim 6, wherein the selecting circuitry comprises a row select decoder (46) and a column select decoder (42).

8. A read-while-write MRAM memory according to claim 3, wherein the selecting circuitry is adapted to provide electrical energy to the first and second column lines (34, 32), the digit lines (4) and the word lines (8) for simultaneous reading of one cell in a column and writing to another cell in the same column or reading from one cell in a row and writing to another cell in the same row.

9. A read-while-write MRAM memory according to claim 8, wherein a row current source (48) is connected to the row select decoder (46) for providing a selected digit line (4) with electrical energy.

10. A read-while-write MRAM memory according to claim 8, wherein a write bit line current source (44) is connected to the column select decoder (42) for providing a selected write bit line (34) with electrical energy.

11. A read-while-write MRAM memory according to claim 6, furthermore comprising sense amplifiers (50) connectable to the second column lines (32).

12. A method of operating a matrix (38) with magnetoresistive memory cells arranged in logically organized rows and columns, each cell including a magnetoresistive element (2), comprising simultaneously reading from one cell in a column and writing to another cell in the same column or simultaneously reading from one cell in a row and writing of another cell in the same row.

13. A method according to claim 12, furthermore comprising selecting one row for reading and another row for writing or selecting one column for reading and another column for writing.

14. A method according to claim 13, wherein the selecting step includes providing electrical energy to a write bit line (34) which is magnetically couplable to the magnetoresistive element (2) to be written, to a read bit line (32) which is electrically couplable to a first electrode of the magnetoresistive element (2) to be read, to a digit line (4) which is magnetically couplable to the memory element (2) to be written and to a word line (8) which is electrically connected to a switching element (T) for connecting a second electrode of the magnetoresistive element (2) to be read to a voltage source (24).

* * * * *